(12) United States Patent
Beranger et al.

(10) Patent No.: US 9,595,837 B2
(45) Date of Patent: Mar. 14, 2017

(54) SYSTEM OF BATTERIES OF ACCUMULATORS WITH SIMPLIFIED SUPERVISION

(75) Inventors: Marc Beranger, Biviers (FR); Marco Ranieri, Gieres (FR)

(73) Assignee: Renault S.A.S., Boulogne-Billancourt (FR)

( * ) Notice: Subject to any disclaimer, the term of this patent is extended or adjusted under 35 U.S.C. 154(b) by 166 days.

(21) Appl. No.: 14/126,092

(22) PCT Filed: Jun. 12, 2012

(86) PCT No.: PCT/EP2012/061119
§ 371 (c)(1),
(2), (4) Date: Dec. 13, 2013

(87) PCT Pub. No.: WO2012/171919
PCT Pub. Date: Dec. 20, 2012

(65) Prior Publication Data
US 2014/0132218 A1   May 15, 2014

(30) Foreign Application Priority Data

Jun. 14, 2011   (FR) ...................................... 11 55181

(51) Int. Cl.
*B60L 11/18* (2006.01)
*H02J 7/00* (2006.01)
(Continued)

(52) U.S. Cl.
CPC ......... *H02J 7/0021* (2013.01); *B60L 11/1851* (2013.01); *B60L 11/1866* (2013.01); *H01M 10/441* (2013.01); *H01M 10/482* (2013.01); *H02J 7/0016* (2013.01); *B60L 2240/545* (2013.01); *B60L 2240/547* (2013.01); *G01R 19/16542* (2013.01); *G01R 31/362* (2013.01); *G01R 31/3658* (2013.01); *H02J 7/0018* (2013.01); *H02J 7/022* (2013.01);
(Continued)

(58) Field of Classification Search
CPC ....... H02J 7/0016; H02J 7/0014; H02J 7/0018
USPC .......................................... 320/119; 324/433
See application file for complete search history.

(56) References Cited

U.S. PATENT DOCUMENTS 7,564,216 B2 *   7/2009   Carrier .................. H02J 7/0021
                                                      320/116
8,237,411 B2 *   8/2012   Liu ..................... H01M 10/441
                                                      320/136

(Continued)

FOREIGN PATENT DOCUMENTS

JP         2009089453        4/2009

*Primary Examiner* — Samuel Berhanu
*Assistant Examiner* — Tarikh Rankine
(74) *Attorney, Agent, or Firm* — Occhiuti & Rohlicek LLP

(57) ABSTRACT

A system of batteries of accumulators includes electrochemical accumulators in series, a power connection connecting either a load or recharging power supply across the accumulators, a control device connected to the accumulators by the power connection, measuring circuits, each of which is attached to a respective accumulator and configured to measure voltage across its terminals, and communication circuits, each of which is attached to an accumulator and configured to induce a voltage drop across its terminals when the measured voltage crosses a threshold. The control device identifies this drop in voltage.

15 Claims, 3 Drawing Sheets

(51) Int. Cl.
    *G01R 31/36*     (2006.01)
    *H01M 10/42*     (2006.01)
    *H01M 10/48*     (2006.01)
    *H01M 10/44*     (2006.01)
    *G01R 19/165*     (2006.01)
    *H02J 7/02*     (2016.01)

(52) U.S. Cl.
    CPC ........ *Y02T 10/7005* (2013.01); *Y02T 10/7061* (2013.01); *Y02T 90/16* (2013.01)

(56) References Cited

U.S. PATENT DOCUMENTS

| | | | |
|---|---|---|---|
| 2003/0214267 A1* | 11/2003 | Long | H02J 7/345 320/116 |
| 2004/0189248 A1 | 9/2004 | Boskovitch et al. | |
| 2005/0083016 A1* | 4/2005 | Yau | H02J 7/0018 320/116 |
| 2006/0132089 A1 | 6/2006 | Ambrosio et al. | |
| 2008/0266913 A1* | 10/2008 | Brotto | H02J 7/0042 363/60 |
| 2010/0090649 A1* | 4/2010 | Sardat | B60L 3/06 320/118 |
| 2012/0025835 A1* | 2/2012 | Chandler | G01R 19/16542 324/433 |

\* cited by examiner

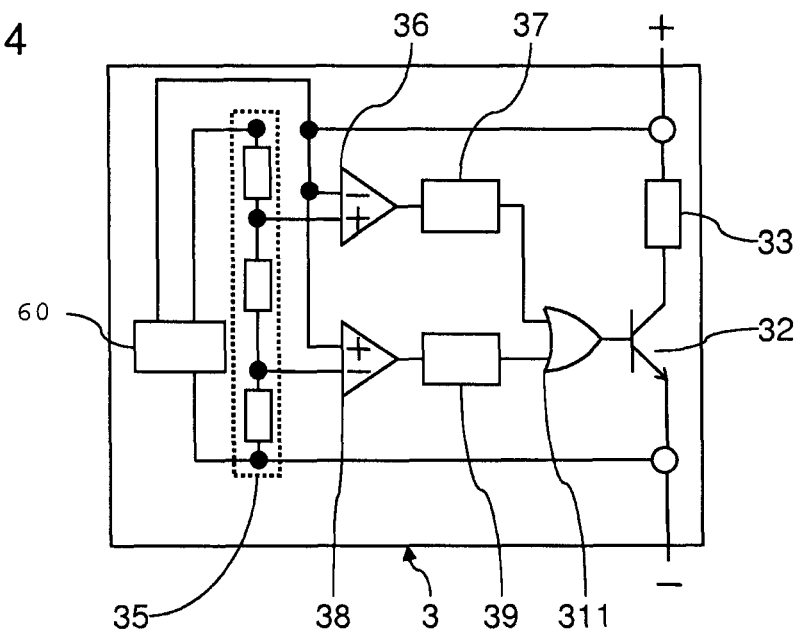
Fig. 4
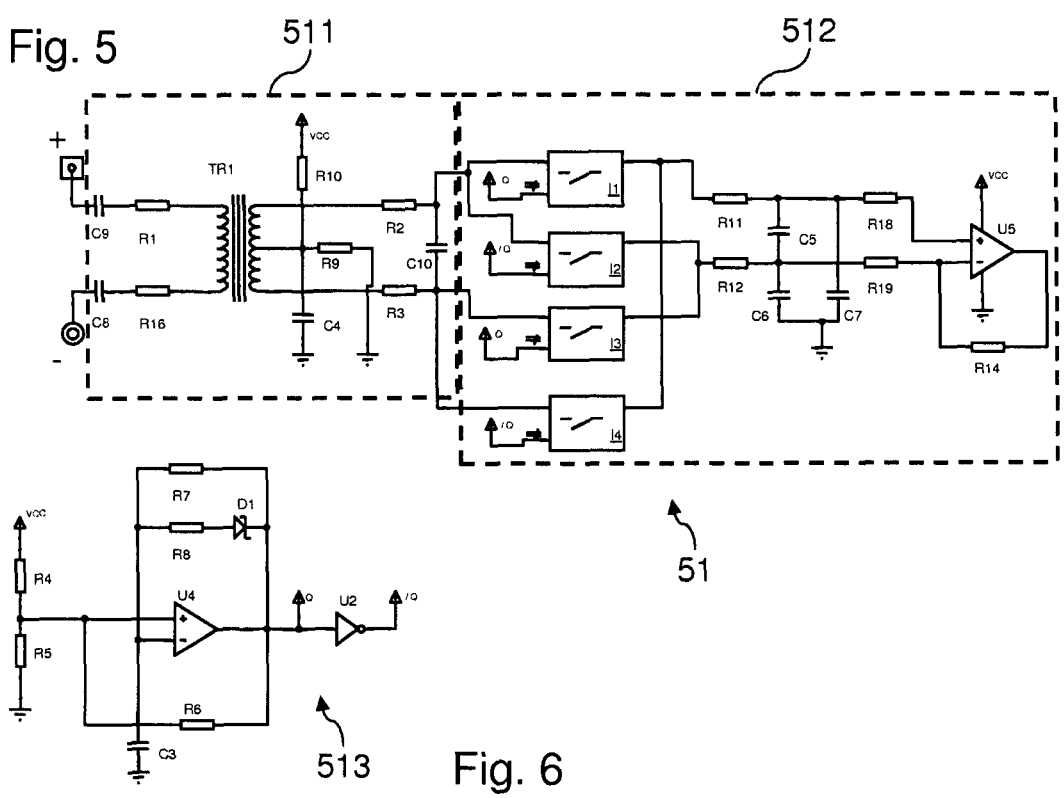
Fig. 5
Fig. 6

SYSTEM OF BATTERIES OF ACCUMULATORS WITH SIMPLIFIED SUPERVISION

RELATED APPLICATIONS

Under 35 USC 371, this application is the national stage of PCT/EP2012/061119, filed on Jun. 12, 2012, which, under 35 USC 119, claims the benefit of the priority date of FR 1155181, filed on Jun. 14, 2011.

FIELD OF DISCLOSURE

The invention pertains to batteries of electrochemical accumulators. These batteries can, for example, be used in the field of electronic and hybrid transportation or embedded systems.

BACKGROUND

An electrochemical accumulator usually has a nominal voltage of the following magnitude:
1.2 V for NiMH type batteries,
3.3 V for lithium ion iron phosphate or LiFePO4, technology,
3.7 V for cobalt-oxide-based lithium ion type technology.

These nominal voltages are too low for the requirements of most systems to be powered. To obtain the appropriate level of voltage, several accumulators are connected in series. To obtain high values of power and capacitance, several groups of accumulators are placed in series. The number of stages (number of groups of accumulators) and the number of parallel-connected accumulators in each stage varies according to the voltage, the current, and the capacitance desired for the battery. The association of several accumulators is called a "battery of accumulators."

The charging of an accumulator results in an increase in the voltage at its terminals. Each accumulator technology has a charging profile that is proper to itself, defined for example by the development in time of the voltage of an accumulator for a given charging current.

An accumulator is considered to be charged, for example when, under a given current, it has reached a nominal voltage level defined by its electrochemical process. If the charging is interrupted before this voltage is reached, the accumulator is not fully charged. The accumulator can also be considered to be charged when the charging has lasted for a predetermined time or again when the charging current, with the accumulator being under constant voltage, has reached a minimum threshold value.

Owing to manufacturing variations, accumulators have different characteristics in practice. These differences, which are relatively low when the battery is new, are accentuated with the heterogeneous wearing out of the accumulators of the battery. Dispersions persist even when accumulators from a common manufacturer are associated in a battery. A control device, which uses voltage measurements from the different accumulators, generally supervises the charging of the battery.

The range of voltage of a cobalt-oxide-based Li-ion type accumulator typically ranges from 2.7 V to 4.2 V. Use outside this range can induce an irreversible deterioration of the accumulators of the battery. Excess charging can lead to destruction of an accumulator, accelerated wear by deterioration of its electrolyte, or an explosion by thermal stalling. Prior-art control devices thus monitor the charging of each accumulator. The charging of all the accumulators is therefore interrupted when the most highly charged accumulator reaches a top limit of its range of operation. The voltage of the least charged accumulator is then equal to a voltage lower than the top limit.

The control device also interrupts the discharging of the battery when the least charged accumulator has reached a low limit of the range of operation.

There are therefore various known connectors to enable the control device to verify the level of charging of each of the accumulators. To increase the level of security of the battery, it is also a frequent practice to use connectors enabling the control device to verify other working parameters such as the temperature of the accumulators.

In a known structure, when several accumulators are present, a circuit for measuring voltage and temperature is fixed onto each accumulator. The control device comprises several slave boards managed by a master board or a computer, these boards being grouped together. Each slave board is connected to several measuring circuits, for example 8 or 16, by means of point-to-point wiring.

In such a structure, the accumulators are at scaled voltages attaining high levels. Thus, the voltage measurements must be either galvanically isolated or designed for a high common mode voltage. In a motor vehicle, the computer is generally powered by a 12 V battery dedicated to the powering of the embedded network and its accessories. Since the battery of the embedded network is connected to the ground of the vehicle, it can furthermore prove to be necessary to set up galvanic isolation for communication between the slave boards and the computer. In addition, the point-to-point wire connections between the measuring circuits and the slave boards require a large number of connections and substantial wiring length. Such a design therefore gives rise to a cost and complexity that are non-negligible. Besides, the number of point-to-point wire connections multiplies the risks of shorting with a direct connection to the accumulators. This calls for particularly careful design and manufacturing that imply especially the integration of the protection systems (fuses or circuit breakers).

The document JP2009-089453 describes a battery provided with several series-connected accumulators, a circuit for measuring voltage at the terminals of the battery, a communications circuit and a control circuit. The communications circuit informs the control circuit about a variation in voltage when the voltage at the terminals of the battery crosses a threshold.

According to another known structure, when there are numerous accumulators present, a circuit for measuring voltage and temperature is fixed onto each accumulator. The measuring circuits are connected to a same communications bus. A computer will retrieve the information transmitted by measuring circuits on this communications bus.

Such a structure avoids the drawbacks of point-to-point wire connections. However, such a structure requires the presence of a bus of particular design having galvanic isolation owing to the voltage levels to which it is subjected. Very special attention must be paid to the design of the bus, since it is connected to very high voltage levels within the battery. Thus, a costly and complex galvanic isolation has to be implemented and the integration of such a bus in a battery raises practical problems.

SUMMARY

The invention is aimed at resolving one or more of these drawbacks. The invention thus pertains to a system of batteries of accumulators comprising:

several electrochemical accumulators connected in series;
an electrical power connection intended to connect an electric load or a recharging power supply to said electrochemical accumulators;
a control device connected to the electrochemical accumulators by means of the electrical power connection.

The system further comprises:
several measuring circuits, each of these measuring circuits being attached to a respective electrochemical accumulator and being configured to measure the voltage at the terminals of this respective accumulator;
several communications circuits, each of these communications circuits being attached to a respective electrochemical accumulator and being configured to induce a drop in voltage at the terminals of this respective accumulator when the measured voltage crosses a threshold.

The control device is configured to identify said drop in voltage.

According to one variant, the measuring circuits and the communications circuits are electrically powered by their respective accumulator.

According to another variant, the communications circuits are configured to induce an alternation of drops in voltage with a frequency ranging from 10 kHz to 1 MHz when the measured voltage crosses a threshold.

According to yet another variant, the communications circuits are configured to induce a drop in voltage at the terminals of their respective accumulators either when the voltage at the terminals of this accumulator crosses a maximum charging voltage or when the voltage at the terminals of this accumulator crosses a minimum discharging voltage.

According to yet another variant, the communications circuits are configured to induce a drop in voltage for the maximum charging voltage with a cyclic ratio greater than the cyclic ratio of the drop in voltage for the minimum discharging voltage.

According to one variant, the communications circuits are configured to achieve distinct drops in voltage, the control device being configured to identify a communications circuit as a function of the drop in voltage achieved.

According to another variant, the system comprises:
a DC/AC converter connected to the electrical power connection;
an anti-parasite filter interposed between the converter and the control device.

According to yet another variant, the system comprises more than twenty series-connected accumulators, the voltage at the terminals of the battery being greater than 50V.

According to yet another variant, the communications circuits are configured to induce a drop in voltage of at least 0.1% at the terminals of their accumulator when the measured voltage crosses a threshold.

According to one variant, the communications circuits induce a drop in voltage at the terminals of their accumulator by the connecting of an electric load between the terminals of their accumulator.

The invention also pertains to a method for managing the charging of electrochemical accumulators in series of a battery comprising the steps of:
measuring the voltage at the terminals of the accumulators by means of measuring circuits attached to respective accumulators;
detecting the crossing of a voltage threshold at the terminals of its respective accumulator by one of said measuring circuits;
generating a drop in voltage at the terminals of the accumulator for which the crossing has been detected;
detecting the drop in voltage by means of a control device connected to the electrochemical accumulators by means of an electrical power connection connecting an electric load or a recharging power supply to said accumulators.

According to one variant, the method comprises the powering of the measuring circuits by means of their respective accumulator.

According to another variant, the generation of a drop in voltage includes an alternation of drops in voltage at the terminals of said accumulator with a frequency ranging from 10 kHz to 1 MHz.

According to yet another variant, the generation of a drop in voltage comprises the connection of an electric element to the terminals of said accumulator, said electric element being configured to induce a drop in voltage of at least 0.1% at the terminals of said accumulator during the connection.

DESCRIPTION OF THE DRAWINGS

Other features and advantages of the invention shall appear clearly from the description given here below by way of an indication that is in no way exhaustive, with reference to the appended drawings, of which:

FIG. 4 is a representation of an example of a logic structure implemented in a measuring circuit according to the invention;

FIG. 5 is a schematic representation of an example of a filtering module;

FIG. 6 is a schematic representation of an example of an oscillator generating a clock signal with different cyclic ratios.

DETAILED DESCRIPTION

The invention proposes to transmit the measurements made by different sensors through carrier current to a control device. The transmission is carried out by lowering the voltage at the terminals of the accumulator across which a voltage is being measured. A measuring circuit is thus attached to the accumulator and induces this drop in voltage by connecting a load to the terminals of the accumulator. The transmission is thus performed by means of power connections of the series-connected accumulators.

The voltage limits the constraints of galvanic isolation of the system and reduces its cost by reducing especially the connection wiring needed to transmit information.

Figure 1:
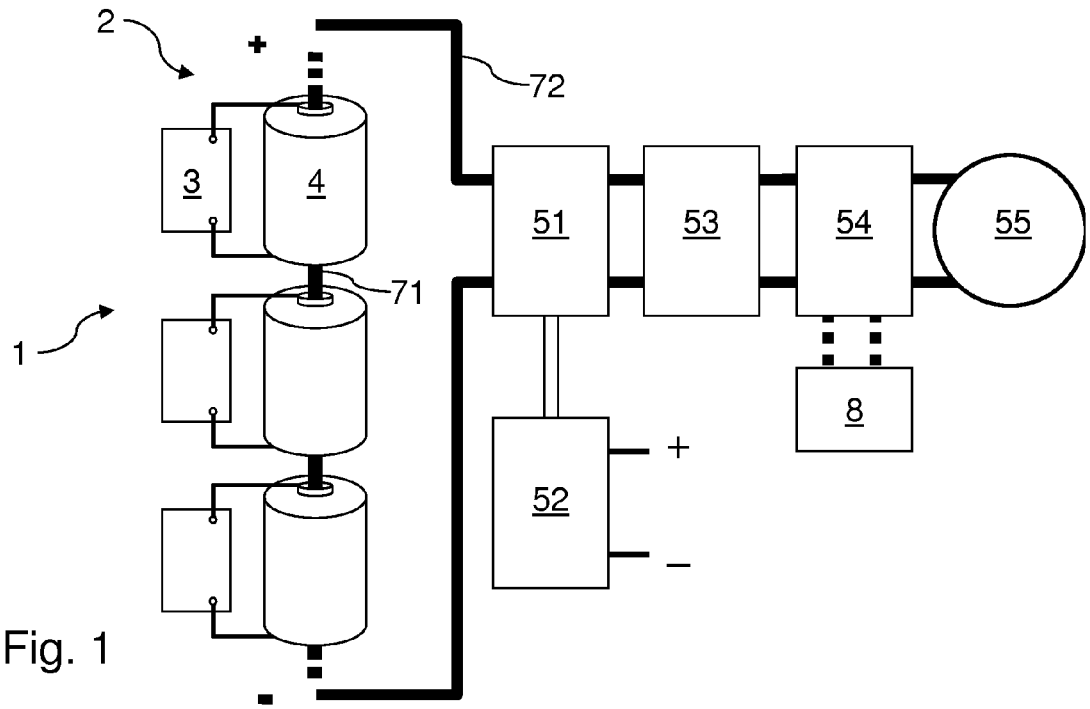
FIG. 1 is a schematic view of an accumulator battery system according to the invention.

FIG. 1 is a schematic illustration of an accumulator battery system 1 according to the invention implemented to ensure the driving of an electric motor 55. The system 1 comprises a battery 2 including series-connected electrochemical accumulators 4. The battery 2 comprises a large number of accumulators 4, typically from 20 to 100 accumulators depending on the voltage needed and the type of accumulators used. The accumulators 4 are series connected by means of electrical power connections 71. Each accumulator 4 comprises a circuit 3 that is attached to it. A circuit 3 is, for example, typically fixed to its associated element. The circuits 3 have a voltage-measuring function as well as a communications function. The circuits 3 are designated here below by the common term "measuring circuit."

The battery 2 is connected to a filtering module 51 by means of electrical power connections 72. An electromagnetic anti-parasite filter 53, known as an EMC filter, is also connected to the battery 2 by means of the electrical power connection 72. The filter 53 is connected between the filtering module 51 and an AC/DC converter 54. The AC/DC converter 54 is also connected to the electrical connections 72 and forms the interface between the battery 2 and the components working under alternating current, in this case an electric motor 55 and a recharging alternating current source 8.

The filter 53 eliminates the electromagnetic disturbances on the DC network during the working of the motor 55. The filter 53 especially filters the high-order harmonics that can be induced by the power switching circuits for the high charging or discharging currents. The filtering module 51 demodulates the information provided by the measuring circuits 3. The filtering module 51 provides a low-voltage signal corresponding to the signal transmitted by the measuring circuits 3. A centralized control device, formed in this case by a computer 52, is connected to the filtering module 51 to retrieve the low-voltage signal. The computer 52 can be powered by a low-voltage network, for example, by the network embedded in an automobile vehicle. Owing to the presence of the filter 53 between the converter 54 and the filtering module 51, the information transmitted by the measuring circuits 3 is not disturbed by the harmonics linked to the chopping carried out in the converter 54 or in the control unit of the motor 55. When pieces of information transmitted by the measuring circuits are encoded, the computer 52 carries out the decoding to identify, for example, the sender measuring circuit and the content of the information transmitted (i.e., voltage value, high-voltage threshold alarm, low-voltage threshold alarm, temperature of the accumulator, etc.). Each measuring circuit 3 can thus have an encoding of its own, for example an encoding by a distinctive pulse width, a distinctive transmission pattern or a distinctive transmission frequency. The system 1 comprises means enabling the selective interruption of the electrical connection between the battery 2 and the converter 54. The battery 2 can thus be selectively isolated from an electric load to be powered or a recharging power supply. The filtering module 51 can, for example, include switches opening electrical connections 72 between the battery and the converter 54. The computer 52 transmits, for example, commands for opening such switches during the detection of an end of charging or the detection of a maximum level of discharging. The computer can also command a reduction of the current let out by the battery 2 when it has reached a discharging threshold so as not to have to suddenly interrupt the electric power supply to the electric load 55.

Figure 2:
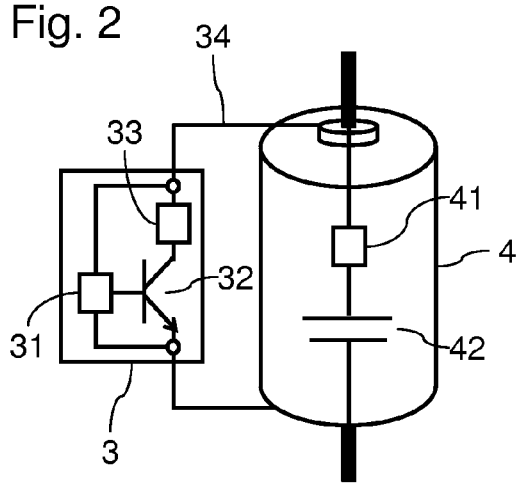
FIG. 2 is an electrical diagram equivalent to the measuring circuit and its associated accumulator.

FIG. 2 represents an equivalent electrical diagram of a measuring circuit 3 and its associated accumulator 4. The circuit 3 comprises an arm comprising the following in series: a power transistor 32, and a discharging resistor 33. This arm is connected parallel to the terminals of the accumulator 4 by a cable 34.

The circuit 34 also comprises a microcontroller 31 connected to the terminals of the accumulator 4. The microcontroller 31 is configured to provide a measurement of voltage at the terminals of the accumulator 4. The microcontroller 31 can also be configured to measure other parameters of operation of the accumulator 4, for example its temperature.

The measuring circuit 3 has a static operating mode in which it measures the voltage at the terminals of the accumulator 4 and a dynamic operating mode in which it communicates with the computer 52.

In static operation, the transistor 32 is off. In this static operation, the microcontroller 31 measures the voltage at the terminals of the accumulator 4.

In dynamic operation, the transistor 32 is on. In this dynamic operation, the microcontroller 31 communicates with the computer 52 in achieving drops in voltage at the terminals of the accumulator 4. These drops in voltage have an amplitude that is sufficient to be detected by the computer 52. The microcontroller 31 thus communicates, by carrier current, with the computer 52 through the electrical power connections 71 and 72. The communication can be obtained by drops in alternating voltage at a predetermined frequency.

According to a simplified model, the accumulator 4 is likened to a DC voltage source 42 series-connected with an internal impedance 41, the order of magnitude of which is 1 mΩ. The arm of the circuit 3 including the power transistor 32 and the discharging resistor 33 is advantageously sized so that the current passing through this arm is not negligible relative to the charging or discharging current of the battery 2. It is possible, for example, to size the resistor 33 in such a way that the closing of the power transistor 32 induces a drop in voltage of the order of 0.1% or even 1% in the accumulator 4. A sudden drop in voltage of the order of 0.1% at the terminals of the accumulator 4 can easily be detected because the voltage at the terminals of the accumulator 4 normally undergoes relatively slow variations. The drop in voltage induced by the circuit 3 can also be expressed in V: the circuit 3 thus advantageously induces a drop in voltage ranging from 1 to 10 mV so that it is easily detectable. The resistor 33 could, for example, have a value of resistance on the order of 3Ω. Thus, if the accumulator were crossed by a current 100 A, the resistor 33 would be crossed by a current of 1 A during the closing of the transistor 32. In order to limit the consumption of current in the circuit 3, the discharge resistor 33 has a value at least 50 times greater than the internal impedance of the accumulator 4 at the transmission frequency.

Although the measuring circuit 3 has been described on the basis of a diagram including a resistor 33 and a power transistor 32 connected in series, this measuring circuit 3 can be made by any appropriate means, for example by using a power transistor having a conduction resistance enabling the generation of a drop in voltage of the required order of magnitude in the accumulator 4.

In one simplified embodiment, the communication between the measuring circuits 3 and the computer 52 is one-way communication. Such an embodiment makes it possible to reduce the complexity of the measuring circuits 3 and their static electrical consumption. It is, however, also possible to envisage the setting up of two-way communications between the measuring circuit 3 and the computer 52.

The transmission of information between the measuring circuit 3 and the computer 52 by carrier current can be achieved by any known modulation technique. In particular, the transmission can be carried out in baseband or by modulation of a carrier.

With measuring circuits 3 that are independent of one another, it is possible that several measuring circuits 3 will simultaneously transmit pieces of information to the computer 52. To prevent interference between these transmissions, it is possible to implement known redundancy mechanisms or error corrector codes.

Figure 3:
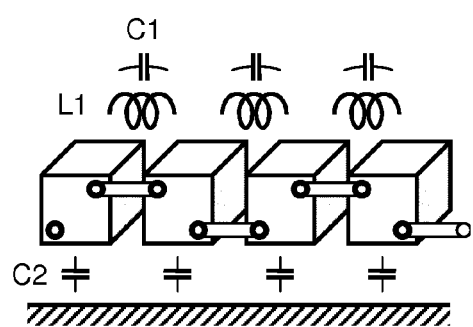
FIG. 3 is a representation illustrating the modeling of the parasitic inductors and capacitors in a battery.

A set of accumulators, all series-connected, can be modeled at high frequency as a lumped constant line, as illustrated in FIG. 3. The power connections between two series-connected accumulators behave like an inductor L1. Meanwhile, each accumulator behaves like a capacitor C2 relative to the ground of the vehicle and induces a capacitance C1 between two series-connected accumulators.

The inductance L1 of an inductor L1 of a series connection between accumulators in the form of a wide and short conductive strip can be defined by the following formula:

$$L1 \approx 0.5 * \mu o * Lo$$

with μo=1.26 μH/m and Lo being the length of the strip.

Thus, the total values of inductance and capacitance of the inductor L1 and the capacitors C2 to be envisaged for a classic sizing of a battery for powering an electric motor of a vehicle are respectively of the order of 100 nH and 20 pF.

Starting from the assumption that the battery 2 comprises 80 series-connected accumulators 4, the battery 2 behaves like a line with a characteristic impedance of 70 ohms with a cut-off frequency above 100 MHz.

The frequency chosen for the transmission of information by the measuring circuits 3 will advantageously be far smaller than this value and will range, for example, from 10 kHz to 1 MHz. In this range of frequencies, the transmission line effects of the inductors L1 and capacitors C2 could be overlooked.

Since the internal resistance of a high-powered accumulator is relatively low, one might expect it to be difficult to bring about measurable voltage variations at its terminals. However, the inventors have noted that, for frequencies exceeding 1 kHz, the inductance of such an accumulator is preponderant over its resistance for computing the impedance. Moreover, the internal resistance of an accumulator is highly non-linear. This resistance is high for low charging currents or discharging currents and diminishes sharply under higher currents. Thus, the measuring current 3 can induce a measurable voltage variation by current inrushes that are high enough for a frequency above 1 kHz. This variation in voltage is therefore far greater than the simple product R×I, where R is the internal resistance of an accumulator and I is the current in the resistor 33.

Since the voltages and currents on the DC network of the system 1 are relatively stable, the variations in impedance at this network are limited. Since the impedance values are predictable and stable, the quality of transmission by carrier current is predictable and reliable. Besides, the frequencies of the harmonics induced by charging and discharging currents are known and predictable. The filter 53 can therefore be specifically planned to attenuate these frequencies and the transmission frequencies of the measuring circuits 3 could also be adapted to distinguish them from these disturbing frequencies. The switching frequencies of a converter 54 of an electric engine vehicle are generally of the order of 25 kHz so as not to create noise discomfort for the users.

Consequently, the communications frequency of the measuring circuit 3 advantageously ranges from 100 kHz to 1 MHz.

FIG. 4 represents an example of a logic structure implemented in a measuring circuit 3. The measuring circuit 3 comprises a generator 60. The generator 60 defines a difference in reference potential. The generator 60 is powered by connections of the circuit 3 to the terminals of the accumulator 4. The generator 60 applies a calibrated potential difference at the terminals of a voltage divider 5. The voltage divider 5 is configured to define a high threshold voltage applied to a first input of a comparator 36 and a low threshold voltage applied to a first input of a comparator 38. The voltage at the terminals of the accumulator 4 is applied to the second inputs of the comparators 36 and 38. Thus, if the difference in potential at the terminals of the accumulator 4 is greater than the high threshold, the comparator 36 passes to the high state. If the difference in potential at the terminals of the accumulator 4 is below the low threshold, the comparator 38 passes to the high state.

Chopper circuits 37 and 39 are connected respectively to the output of the comparator 36 and the comparator 38. The chopper circuits 37 and 39 generate signals with distinct cyclic ratios when they receive a signal in the high state. The chopper circuit 37 can for example generate a cyclic ratio set at 90%. The chopper circuit 39 can generate a fixed cyclic ratio of 10%. The outputs of the chopper circuits 37 and 39 are connected to the input of an OR gate 311. The output of the OR gate 311 is connected to the control electrode of the power transistor 32. Thus, if the difference in potential at the terminals of the accumulator 4 reaches one of the voltage thresholds, the power transistor 32 is closed at a predefined frequency with the cyclic ratio corresponding to the threshold reached. The voltage at the terminals of the accumulator 4 is thus lowered with this cyclic ratio.

In order to limit the discharging of the accumulator 4, the measuring circuit 3 could limit the duration of its dynamic operation. The transmission of the information by the measuring circuit 3 could be interrupted when the voltage at the terminals of the accumulator 4 crosses a low cut-off threshold in order to prevent the continuation of the discharging of this accumulator, which has already reached its discharging limit.

Advantageously, the cyclic ratio of the chopper circuit 37 is relatively high so that the measuring circuit 3 can be used to dissipate the charging current of the accumulator 4 that has reached the high voltage threshold and thus take part in balancing the charging of the accumulators 4 of the battery 2.

The cyclic ratio of the chopper circuit 39 is advantageously very low so that the electrical consumption at the accumulator 4 is greatly reduced when this accumulator has reached its low threshold voltage.

If the transmission of the information by the measuring circuit 3 is limited to the crossing of the voltage thresholds by the accumulator 4, the measuring circuit 3 is in dynamic operation only for a very short duration. As a result, the electrical consumption of the measuring circuit 3 is, on an average, extremely reduced.

Although this example describes an analog solution, the measuring circuit 3 can also be made in a digital version, for example by means of a microcontroller.

Since the measuring circuit 3 is permanently powered by its associated accumulator 4, the consumption of this accumulator in static operation must be as low as possible. The measuring circuit 3 can easily be made with reduced static consumption, for example consumption of 10 to 100 μA, which corresponds to the order of magnitude of the usual self-discharging current of an electrochemical accumulator.

It is of course possible to apply alternatives to the use of distinct cyclic ratios for encoding of information to be transmitted to the computer 52. To avoid interference between transmissions from the different measuring circuits 3, it is easy to implement communication towards a computer 52 based on appropriate codes.

The encoding used for the communication of a measuring circuit 3 with the computer 52 is thus intended to enable both the identification of this measuring circuit 3 and the reading of the measurement of this circuit at the computer 52. Several measuring circuits can thus simultaneously communicate with the computer 52 without mutual interference.

It is possible especially to use a spread code based on a pseudo-random sequence. A pseudo-random sequence is a series of bits (0 or 1) that appear to be random but which are actually periodic. A transmitted sequence takes the name of a symbol. The set of possible symbols complying with the same properties takes the code name.

Two characteristics of these sequences are advantageous:
1. The self-correlation of each symbol is high. A high self-correlation value is used to identify one transmitted symbol among several symbols received by a demodulator.
2. The inter-correlation between symbols is low. A low inter-correlation value prevents inter-symbol interference: a demodulator can then reliably identify them univocally even if they have been received simultaneously.

In one variant, it is possible to use codes based on a maximum length sequences (Gold, Walsh, Kasami, etc). These codes have very high performance in terms of self-correlation.

Signals transmitted by measuring circuits 3 are acquired. Then, for example, the correlation between the acquired signal and the different codes is determined and the measuring circuit 3 and its information are identified by hypothesis testing based on a fixed threshold in taking account of the signal-to-noise ratio and the level of inter-cell interference.

For example, the Kasami code has very good properties of self-correlation and inter-correlation. To verify these properties, tests were made especially with a 63-bit Kasami code that gives 16 different symbols (sufficient for four cells and three distinct values of information to be transmitted for each). The tests were carried out in a laboratory on four cells of a battery with a bit sending frequency of 200 kHz, a symbol sending frequency 2 Hz and a sampling frequency of 5 MHz in acquisition (this frequency is higher than those that would be used in the application that can be envisaged, in order to assess the signal-to-noise ratio).

Figure 7:
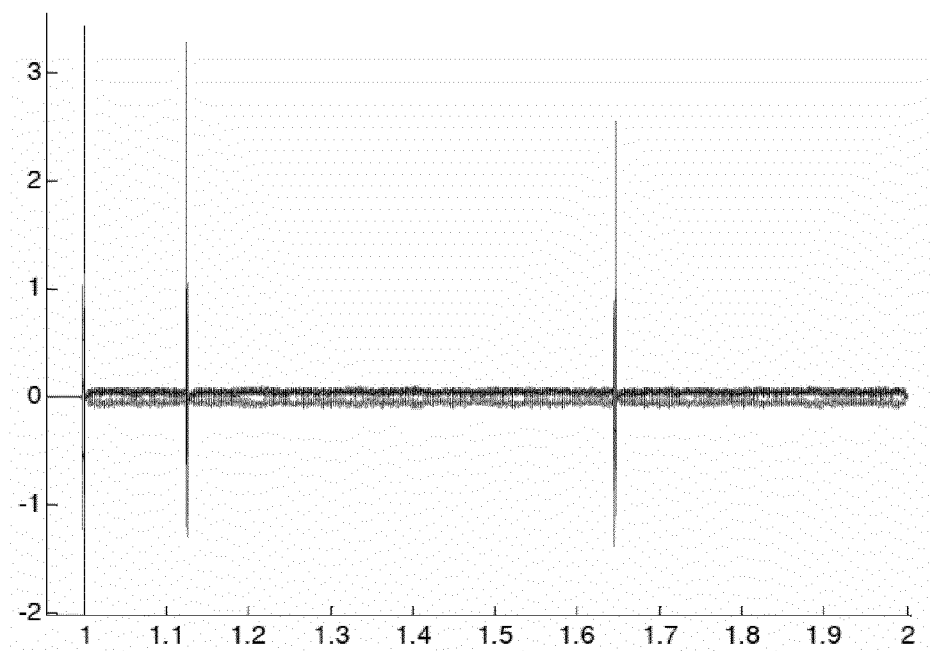
FIG. 7 is a graph representing a correlation measured between different transmissions in one variant of encoding.

FIG. 7 represents the correlation of a signal measured at the computer 52 on a 200 ms time slot. Here, the figure identifies the transmission of three symbols by three different measuring devices 3. Each peak corresponds to a distinct symbol. Much smaller peaks are induced by a non-zero inter-correlation between the symbols, which however is very limited. By performing an operation of demodulation by correlation on the rough signal acquired with an oscilloscope, a signal-to-noise ratio of 19.6 dB is estimated without any amplification or filtering.

To reduce the sensitivity of the transmission to electromagnetic noises, it is possible to make the transmission by modulating an appreciably higher frequency carrier, for example between 1 and 30 MHz. The carrier can be generated in the measuring circuit 3 by a circuit on the basis of a quartz oscillator and the modulation can be done with an XOR (exclusive-or) type of gate. An input terminal of the gate receives the carrier and another input terminal of the gate receives the code in baseband, for example the Kasami code. Thus, a PSK type phase modulation is achieved with a 180° phase change of the carrier during a bit change.

A code based on maximum-length sequences (m-sequence type code) will advantageously be parameterized (length of the code, performance level of correlation, number of symbols) according to the speed of transmission available, the number of information states to be transmitted or the memory of a microcontroller of the measuring circuit 3.

Another variant uses codes known as orthogonal codes having zero inter-correlation but lower self-correlation.

To reconcile the communication of the measuring circuits 3 with the basic functions of the computer 52 (balancing the accumulators, protecting the cells against excessive charging or excessive discharging), the communication advantageously interposes pauses between the transmitted symbols.

To limit the consumption of energy by the transmission carried out by the measuring circuits, these transmissions could come into play only when special conditions of operation of the battery are detected.

FIGS. 5 and 6 illustrate an example of a filtering module 51. The filtering module 51 comprises a circuit for filtering and lowering the voltage level 511, a sampling circuit 512, and an oscillator 513 generating a clock signal with a variable cyclic ratio. The input terminals of the circuit 511 are connected to the terminals of the battery 2 by means of the power connection 72. The circuit 511 comprises a voltage-reducing transformer TR1, the primary winding of which is connected to the input terminals of the circuit 511 respectively by means of a capacitor C9 and a resistor R1 in series and by means of a capacitor C8 and a resistor R16 in series. The secondary winding of the transformer TR1 is connected to the output terminals of the circuit 511 respectively by means of the resistor R2 and by means of the resistor R3. A capacitor C10 is connected between the output terminals of the circuit 511. A mid-point of the secondary winding of the transformer TR1 is connected to a low-voltage power supply Vcc by means of a resistor R10 and connected to ground by means of a resistor R9 and a capacitor C4 in parallel.

The oscillator 513 selectively generates the complementary clock signals Q and /Q. The complementary signals Q and /Q can respectively have cyclic ratios of 90% and 10%. The circuit 513 comprises resistors R4 and R5 series-connected between the voltage Vcc and ground. The circuit 513 comprises an operational amplifier U4, the non-inverted input of which is connected to an intermediate node between the resistors R4 and R5. The non-inverter input is connected to the output of the amplifier U4 by means of a resistor R6. The inverter input of the amplifier U4 is connected to ground by a capacitor C3. The inverter input is connected to the output of the amplifier U4 by means of two parallel-connected arms: a first arm comprising a resistor R7 and a second arm comprising a resistor R8 and a Zener diode D1 connected in series (any other type of diode can also be used). The resistor R7 is approximately ten times greater than the resistor R8 in order to obtain the desired cyclic ratios. Depending on the sense of the current in the Zener diode D1, the capacitor C3 is charged or discharged. The output of the amplifier U4 provides the clock signal Q with a 90% cyclic ratio. An inverter U2 is connected to the output of the amplifier U4 and provides the complementary clock signal /Q with a cyclic ratio of 10%.

The input terminals of the sampling circuit 512 are connected to the output terminals of the circuit 511. The sampling circuit 512 comprises switches I1, I2, I3 and I4. The input of the switches I1 and I2 is connected to a first input terminal of the circuit 512, the input of the switches I3 and I4 is connected to a second input terminal of the circuit 512. The control input of the switches I1 and I3 is connected to the clock signal Q. The control input of the switches I2 and I4 is connected to the clock signal /Q. The output of the switches I1 and I4 is connected to the non-inverter input of an amplifier U5 by means of series-connected resistors R11 and R18. The output of the switches I2 and I3 is connected to the inverter input of the amplifier U5 by means of series-connected resistors R12 and R19. A capacitor C5 connects the intermediate node between the resistors R11 and R18 and the intermediate node between the resistors R12 and R19. These intermediate nodes are connected to ground respectively by capacitors C6 and C7. These capacitors C5 to C7 and R11, R12, R18 and R19 form a circuit for blocking the sampled signals. The inverter input of the amplifier U5 is connected to its output by a resistor R14. The signal at the output of the amplifier U5 is given to the computer 52.

The frequency of the clock signals Q and /Q generated by the circuit 513 is close to but not equal to the frequency of modulation of the measuring circuit 3 in communication. Thus, the signal sampled by the circuit 512 has a low frequency proportional to the difference between the frequency of the clock signal Q and the frequency of communication of the measuring circuit 3. Such a circuit 51 advantageously makes it possible to determine the cyclic ratio of the signal generated by the measuring circuit 3 despite potential disturbances on the power connections 72. The computer 52 can determine the cyclic ratio of the signal generated by the measuring circuit 3 by measuring the respective durations of the positive and negative signals at the output of the amplifier U5.

In the example illustrated, each series-connected accumulator 4 has a measuring circuit 3. The invention can also be applied to batteries comprising several series-connected stages, each stage comprising several parallel-connected electrochemical accumulators. In such a configuration, a measuring circuit 3 is connected to the terminals of each stage.

Although the measuring function and the communications function are implemented by a common circuit 3 in the invention described herein, these two functions can also be implemented by two distinct circuits.

The invention claimed is:

1. An apparatus comprising a system of batteries of electrochemical accumulators, said system comprising a plurality of electrochemical accumulators connected in series, an electrical power connection disposed to connect at least one of an electric load and a recharging power supply across said plurality of electrochemical accumulators, a control device connected to said plurality of electrochemical accumulators by said electrical power connection, a corresponding plurality of measuring circuits, each of which is attached to a respective electrochemical accumulator and configured to measure a DC voltage across terminals of said respective electrochemical accumulator, and a corresponding plurality of communication circuits, each of which is attached to a respective electrochemical accumulator and configured to modulate the DC voltage by inducing a plurality of drops in voltage across terminals of said respective electrochemical accumulator at a predetermined frequency to produce an encoded communication when said measured voltage crosses a threshold, wherein there is further included a filter module connected to the electrical power connection and to the control device and configured to produce a low voltage signal corresponding to the modulated DC voltage and wherein said control device is configured to receive the low voltage signal and to decode said encoded communication from the low voltage signal.

2. The apparatus of claim 1, wherein each measuring circuit in said corresponding plurality of measuring circuits is electrically powered by an electrochemical accumulator to which said measuring circuit is attached, and wherein each communication circuit in said plurality of communication circuits is electrically powered by an electrochemical accumulator to which said communication circuit is attached.

3. The apparatus of claim 1, wherein said communication circuits are configured to induce said plurality of drops in voltage with a frequency ranging between ten kilohertz and one megahertz when said measured voltage crosses said threshold.

4. The apparatus of claim 1, wherein each of said communication circuits from said plurality of communication circuits is configured to induce said plurality of drops in voltage across said terminals of said respective electrochemical accumulator to which said communication circuit is attached upon occurrence of an event, wherein said event is selected from the group consisting of said voltage at said terminals of said electrochemical accumulator crossing a maximum charging voltage, and said voltage at said terminals of said electrochemical accumulator crossing a minimum discharging voltage.

5. The apparatus of claim 4, wherein each of said communication circuits from said plurality of communication circuits is configured to induce said plurality of drops in voltage for said maximum charging voltage with a cyclic ratio greater than a cyclic ratio with which said communication circuit induces said plurality of drops in voltage for said minimum discharging voltage.

6. The apparatus of claim 1, wherein each communication circuit from said plurality of communication circuits is configured to induce a distinct drop in voltage that differs from drops in voltage induced by other communication circuits in said plurality of communication circuits, and wherein said control device is configured to identify said communication circuit based at least in part on said distinct drop in voltage.

7. The apparatus of claim 1, wherein each of said communication circuits from said plurality of communication circuits is configured to encode an identifier of a measuring circuit to which said communication circuit is attached by a pseudo-random code when said measured voltage crosses a threshold.

8. The apparatus of claim 1, further comprising a DC/AC converter connected to said electrical power connection, and an anti-parasite filter interposed between said DC/AC converter and said control device.

9. The apparatus of claim 1, wherein said plurality of electrochemical accumulators comprises a battery of more than twenty series-connected accumulators, and wherein a voltage across terminals of said battery exceeds fifty volts.

10. The apparatus of claim 1, wherein each of said communication circuits from said plurality of communication circuits is configured to induce said plurality of drops in voltage of at least 0.1% at said terminals of an electrochemical accumulator to which said communication circuit is attached in response to said measured voltage crossing a threshold.

11. The apparatus of claim 1, wherein each communication circuit from said plurality of communication circuits is configured to connect an electrical load across terminals of an electrochemical accumulator to which said communication circuit is attached, thereby causing a drop in voltage across said terminals.

12. A process for managing charging of a battery of electrochemical accumulators connected in series, said process comprising for each of said electrochemical accumulators, using a measuring circuit attached to said electrochemical accumulator to measure a DC voltage across terminals of said electrochemical accumulator, detecting when a DC voltage measured across said terminals crosses a voltage threshold, and upon detecting a crossing of said voltage threshold by said measured DC voltage, modulating the DC voltage by causing a plurality of drops in voltage across said terminals at a predetermined frequency to produce an encoded communication, using a filter module connected to said electrochemical accumulators by a power connection that connects one of an electrical load and a rechargeable power supply to said electrochemical accumulators to produce a low voltage signal corresponding to the modulated DC voltage; and using a control device connected to the filter module and to said electrochemical accumulators by the power connection to decode said encoded communication from the low voltage signal.

13. The process of claim 12, further comprising powering each of said measuring circuits using a respective electrochemical accumulator to which said measuring circuit is attached.

14. The process of claim 12, wherein causing said plurality of drops in voltage comprises causing said plurality of drops in voltage at said terminals of said electrochemical accumulators with a frequency ranging between ten kilohertz and one megahertz.

15. The process of claim 12, wherein causing said plurality of drops in voltage comprises connecting an electrical element across said terminals of said electrochemical accumulator, said electric element being configured to induce said plurality of drops in voltage of at least 0.1% at said terminals of said accumulator during connection thereof.

* * * * *